(12) United States Patent
Joshi et al.

(10) Patent No.: US 11,754,343 B2
(45) Date of Patent: Sep. 12, 2023

(54) PHASE CHANGE HEAT-STORING MECHANISMS FOR SUBSTRATES OF ELECTRONIC ASSEMBLIES

(71) Applicant: Toyota Motor Engineering & Manufacturing North America, Inc., Plano, TX (US)

(72) Inventors: Shailesh N. Joshi, Ann Arbor, MI (US); Ercan M. Dede, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 557 days.

(21) Appl. No.: 16/674,784

(22) Filed: Nov. 5, 2019

(65) Prior Publication Data

US 2021/0131740 A1    May 6, 2021

(51) Int. Cl.
| | |
|---|---|
| *F28D 15/00* | (2006.01) |
| *H01L 23/367* | (2006.01) |
| *H01L 23/427* | (2006.01) |
| *F28F 23/00* | (2006.01) |
| *C09K 5/06* | (2006.01) |

(52) U.S. Cl.
CPC .............. *F28D 15/00* (2013.01); *C09K 5/063* (2013.01); *F28F 23/00* (2013.01); *H01L 23/3677* (2013.01); *H01L 23/4275* (2013.01)

(58) Field of Classification Search
CPC ...... F28D 15/00; F28F 23/00; H01L 23/3677; H01L 23/4275
See application file for complete search history.

(56) References Cited

U.S. PATENT DOCUMENTS

| | | | | |
|---|---|---|---|---|
| 6,133,631 | A  * | 10/2000 | Belady | F28D 15/0233 257/713 |
| 6,212,074 | B1 * | 4/2001  | Gonsalves | H01L 23/4275 174/16.3 |
| 7,100,680 | B2 * | 9/2006  | Dussinger | H01L 23/427 165/83 |
| 7,886,809 | B2   | 2/2011  | Searls et al. | |
| 8,937,384 | B2   | 1/2015  | Bao et al. | |
| 9,331,053 | B2   | 5/2016  | Arora et al. | |
| 10,269,682 | B2  | 4/2019  | Hsieh et al. | |

(Continued)

FOREIGN PATENT DOCUMENTS

| | | |
|---|---|---|
| CN | 107195603 A | 9/2017 |
| CN | 109216301 A | 1/2019 |

*Primary Examiner* — Jon T. Schermerhorn, Jr.
(74) *Attorney, Agent, or Firm* — Dinsmore & Shohl LLP

(57) ABSTRACT

Embodiments of the disclosure relate to an electronic assembly including a substrate having a first surface and a second surface opposite to the first surface and one or more electronic devices bonded to the first surface of the substrate. A first heat-storing region is embedded within the substrate and proximate to the second surface. The first heat-storing region comprises a phase change material encapsulated by an encapsulating layer. A melting temperature of the encapsulating layer is higher than a melting temperature of the phase change material and a maximum operating temperature of the one or more electronic devices. A heat transfer layer is embedded within the substrate and thermally connects the first heat-storing region to the one or more electronic devices.

16 Claims, 6 Drawing Sheets

(56) References Cited

U.S. PATENT DOCUMENTS

| | | | |
|---|---|---|---|
| 2005/0007740 A1* | 1/2005 | Neuschuetz | H01L 23/4275 257/E23.089 |
| 2008/0272331 A1* | 11/2008 | Mohapatra | C09K 5/10 977/840 |
| 2011/0198059 A1* | 8/2011 | Gavillet | H01L 23/473 977/773 |
| 2012/0206880 A1* | 8/2012 | Andres | H01L 23/4275 361/700 |
| 2016/0290739 A1* | 10/2016 | Mochizuki | F28F 3/046 |
| 2017/0311478 A1* | 10/2017 | Engelhardt | H01L 23/4275 |
| 2017/0314870 A1* | 11/2017 | Lin | F28F 3/08 |
| 2017/0374764 A1* | 12/2017 | Chauhan | H01L 23/36 |

* cited by examiner

US 11,754,343 B2

PHASE CHANGE HEAT-STORING MECHANISMS FOR SUBSTRATES OF ELECTRONIC ASSEMBLIES

TECHNICAL FIELD

The present specification generally relates to thermal management of electronic assemblies, and more specifically, to electronic assemblies having a heat-storing mechanism with enhanced thermal capacity.

BACKGROUND

Electronic devices are often utilized in high-power electrical applications, such as inverter systems for hybrid vehicles and electric vehicles. The electronic devices may be power semiconductor devices such as power insulated-gate bipolar transistors (IGBTs) that are bonded to a substrate. Flexible printed circuit board substrates (PCBs) for electronic devices and systems are also generally known for their use in high-power electrical applications and typically include dielectric substrates.

With advances in battery technology in electric vehicles and increases in electronic device packaging density, operating temperatures of electronic devices have increased and are currently approaching 200° C. which result in increased thermomechanical stresses endured by the electronic devices. Due to variation in coefficient of thermal expansion (CTE) between the electronic device, the bonding layer, and the substrate, thermally-induced stresses may cause damage to the electronic assembly. For example, although bonding layers formed by transient liquid phase (TLP) bonding results in a bonding layer having a melting temperature greater than 200° C., such TLP bonding layers are very brittle and susceptible to damage from the thermally-induced stresses.

Structures and materials that mitigate the thermally-induced stresses in electronic devices may be desirable. Dedicated cooling mechanisms and systems may be typically employed to cool the electronic devices and keep them below a maximum operating temperature. However, such cooling systems can be complicated and expensive. Heat-storing mechanisms may thus be desirable to mitigate the thermally-induced stresses.

SUMMARY

The present specification relates to an electronic assembly having a heat-storing mechanism with enhanced thermal capacity. In one embodiment, a substrate for an electronic assembly includes a first surface, a first heat-storing region embedded within the substrate and proximate to a second surface opposite to the first surface, and a heat transfer layer embedded within the substrate. The first surface is configured to be bonded to one or more electronic devices. The first heat-storing region comprises a phase change material encapsulated by an encapsulating layer. A melting temperature of the encapsulating layer is higher than a melting temperature of the phase change material and a maximum operating temperature of the one or more electronic devices. The heat transfer layer thermally connects the first heat-storing region to the one or more electronic devices.

In another embodiment, an electronic assembly includes a substrate having a first surface and a second surface opposite to the first surface and one or more electronic devices bonded to the first surface of the substrate. A first heat-storing region is embedded within the substrate and proximate to the second surface. The first heat-storing region comprises a phase change material encapsulated by an encapsulating layer. A melting temperature of the encapsulating layer is higher than a melting temperature of the phase change material and a maximum operating temperature of the one or more electronic devices. A heat transfer layer is embedded within the substrate and thermally connects the first heat-storing region to the one or more electronic devices.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments described herein are directed to electronic assemblies having a heat-storing mechanism with enhanced thermal capacity. Electronic devices, such as semiconductor chips, are coupled to a substrate (as a non-limiting example, by a solder layer) acting as ground plane to form the electronic assembly. The substrate includes an embedded heat-storing mechanism that enhances the thermal capacity of substrate to absorb heat generated by the electronic devices. The heat-storing mechanism includes one or more heat-storing regions that are positioned in configurations that enable flow of heat thereto and subsequent storage of heat therein. This removes the necessity for additional dedicated cooling mechanisms for the electronic devices.

Each heat-storing region includes a phase change material having low melting temperature (e.g., indium, tin, bismuth, paraffin wax, low-melting alloy, and the like) and may be encapsulated by a layer of a metal or other material of high melting temperature that is higher than the operating temperature of the electronic devices. When the electronic device(s) are operated at a temperature above the melting temperature of the phase change material, the heat generated by the electronic device(s) flows into the heat-storing region and melts the phase change material from solid form into liquid form within the encapsulating layer. The encapsulating layer aids the flow of heat into the phase change material and prevents the molten phase change material from leaking out.

Figure 1A:
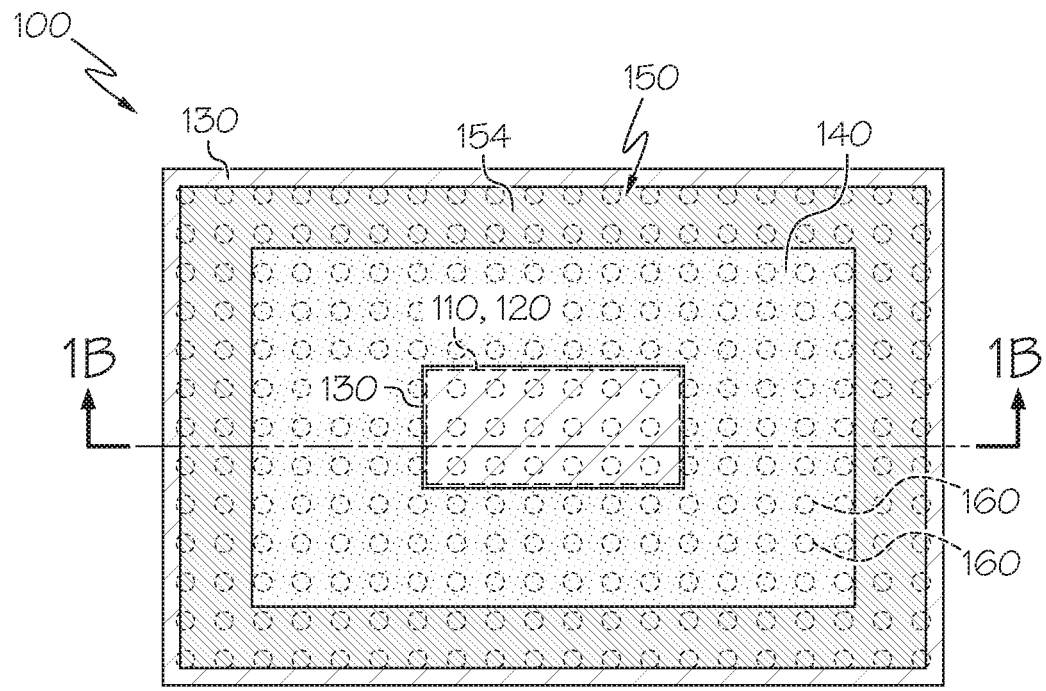
FIG. 1A depicts a cross-sectional top view of an example electronic assembly having a cuboidal substrate and a heat-storing region comprising a phase change material, according to one or more embodiments shown and described herein.
Figure 1B:
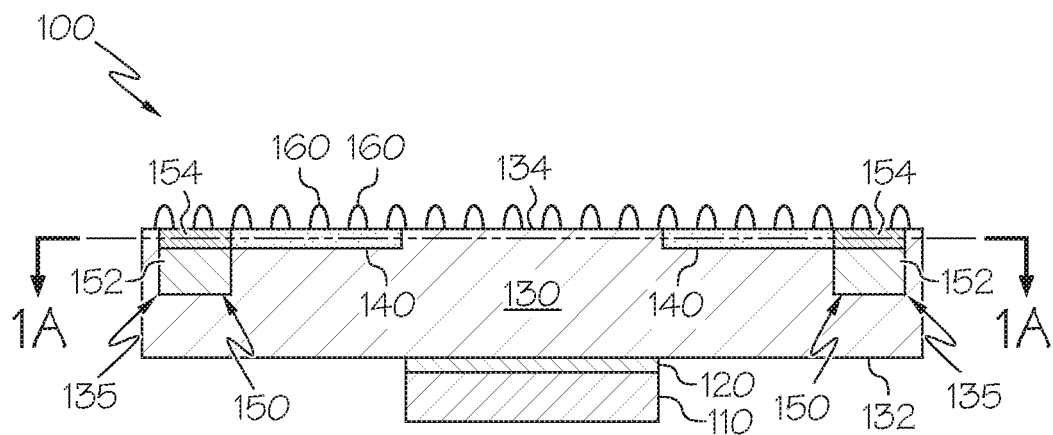
FIG. 1B depicts a cross-sectional side view of the electronic assembly of FIG. 1A, according to one or more embodiments shown and described herein.

Referring to the figures, FIG. 1A and FIG. 1B depict a cross-sectional top view and a cross-sectional side view respectively of an example electronic assembly 100 having a cuboidal substrate 130. The substrate 130 has a first surface 132 and a second surface 134 opposite to the first surface 132. One or more electronic devices 110 may be bonded to the first surface 132 through a bonding layer 120. The bonding layer 120 may be a solder layer, a transient liquid phase (TLP) bonding layer, or another appropriate bonding layer. In some embodiments, the bonding layer 120 may be deposited at discrete positions on the substrate 130. In other embodiments, the bonding layer 120 may be a continuous layer on the substrate 130.

The substrate 130 may be formed from any suitable thermally-conductive metal or metal alloy such as, but not limited to, copper (Cu), nickel (Ni), aluminum (Al), Cu alloys, Al alloys, direct-bonded-copper substrates, semiconductor (e.g., silicon) substrates and the like. As a non-limiting example, the substrate 130 may have a thickness between about 0.2 millimeter and about 10 millimeters. The second surface 134 provides a thermal interface for air-cooling or a liquid cooling device. In some embodiments, the second surface 134 of the substrate 130 may include a plurality of heat sink fins 160 as a secondary cooling mechanism to dissipate additional heat from the substrate 130.

While a single electronic device 110 is shown in the embodiment described in FIGS. 1A-1B, the disclosure is not intended to be limited as such and may include more than one electronic device 110. In some embodiments, the one or more electronic devices 110 may be semiconductor devices such as, without limitation, an insulated gate bipolar transistor (IGBT), a reverse conducting IGBT (RC-IGBT), a metal-oxide-semiconductor field-effect transistor (MOSFET), a power MOSFET, a diode, a transistor, and/or combinations thereof (e.g., power cards). In some embodiments, the electronic devices 110 may be wide-bandgap semiconductor devices formed from any suitable material such as, but not limited to, silicon carbide (SiC), aluminum nitride (AlN), gallium nitride (GaN), gallium oxide ($Ga_2O_3$), boron nitride (BN), diamond, and/or the like. In some embodiments, such as in hybrid vehicles or electric vehicles, the one or more electronic devices 110 may be electrically coupled to each other to form an inverter circuit or system for driving one or more electric motors. The configuration shown in FIGS. 1A-1B and described above is merely an example and other possible configurations are deemed entirely within the scope of this disclosure.

In the embodiment shown in FIGS. 1A-1B, the substrate 130 includes a heat-storing region 150 embedded within a groove 135 of the substrate 130 proximate to the second surface 134 around a perimeter of the second surface 134. The heat-storing region 150 includes a phase change material 152 encapsulated by an encapsulating layer 154. The phase change material 152 has a relatively low melting temperature that transforms into liquid form upon absorption of sufficient heat. As non-limiting examples, the phase change material 152 may be a metal such as, but are not limited to, tin (Sn), indium (In), bismuth (Bi), tin alloys, indium alloys, gallium, n-eicosane (organic), other metals having melting temperatures between about 50° C. and about 250° C., or combinations of these. As another non-limiting example, the phase change material 152 may be a paraffin wax comprising one or a plurality of saturated hydrocarbons having at least 20 carbon atoms, such as from 20 to 40 carbon atoms and a melting temperature in a range between about 50° C. and about 250° C. The melting temperature of the phase change material 152 is lower than the maximum operating temperature of the electronic device(s) 110. As a non-limiting example, the phase change material 152 may have a thickness between about 50 micrometers and about 1000 micrometers. The phase change material 152 may be deposited on the dielectric layer 330 using a process such as, but not limited to, physical vapor deposition, chemical vapor deposition, electroplating, and the like.

The encapsulating layer 154 is formed from a metal having a high melting temperature such as, but not limited to, ruthenium, rhodium, palladium, osmium, iridium, platinum, and the like. The encapsulating layer 154 may be formed through atomic layer deposition or electrodeposition on the phase change material 152 by any known or yet-to-be-developed process. The encapsulating layer 154 has a melting temperature higher than both a melting temperature of the phase change material 152 and a maximum operating temperature of the electronic device(s) 110. As a non-limiting example, the encapsulating layer 154 may have a thickness between about 50 nanometers and about 1000 nanometers. In some embodiments, the encapsulating layer 154 may have a Young's modulus that enables the encapsulating layer 154 to flex when the phase change material 152 transforms into liquid form such that thermally-induced mechanical stresses in the substrate 130 are minimized.

The example substrate 130 includes a heat transfer layer 140 embedded within. The heat transfer layer 140 extends between and thermally connects the heat-storing region 150 to the one or more electronic devices 110. In some embodiments such as the one shown in FIGS. 1A-1B, the heat transfer layer 140 is proximate to the second surface 134 and stretches between the heat-storing region 150 and a thermal projection of the electronic device 110 along the second surface 134 of the substrate 130. In some embodiments, the heat transfer layer 140 may be an inlay formed from a material having a high thermal conductivity, such as a material having thermal conductivity greater than 100 W/m*K, In other embodiments, the heat transfer layer 140 may be a heat pipe having a condenser section proximate to the heat-storing region 150 and an evaporator section proximate to the one or more electronic devices 110. The heat generated by the electronic device(s) 110 boils a working fluid at or near the evaporator section to form a vapor of the working fluid, which then flows along a central adiabatic section to the condenser section. The vapor of the working fluid transfers the heat to the heat-storing region 150 at or near the condenser section and transforms into the liquid form of the working fluid, which flows back to the evaporator section along the central adiabatic section by capillary action. The heat transfer layer 140 embedded within the substrate 130 may be configured in various other ways and are not restricted to the non-limiting examples outlined above.

In operation, as the operating temperature of the electronic device(s) 110 increases, the heat generated by the electronic device(s) 110 flows into the heat transfer layer 140. Due to the high thermal conductivity of the heat transfer layer 140, the heat subsequently flows into the phase change material 152 of the heat-storing region 150, which is also highly thermally conductive. The heat is absorbed by the phase change material 152, which may transform from solid to liquid form, when the operating temperature of the electronic device(s) 110 reaches the melting temperature of the phase change material 152. The heat is unable to melt the encapsulating layer 154 since the melting temperature of the encapsulating layer 154 is higher than the maximum operating temperature of the electronic device(s) 110. Thus, the encapsulating layer 154 prevents the phase change material in liquid form from leaking out. In this way the heat-storing region 150 including the phase change material 152 encapsulated by the encapsulating layer 154 provides an effective thermal management solution for high-capacity absorption and storage of the heat generated by the electronic device(s) 110.

Figure 2A:
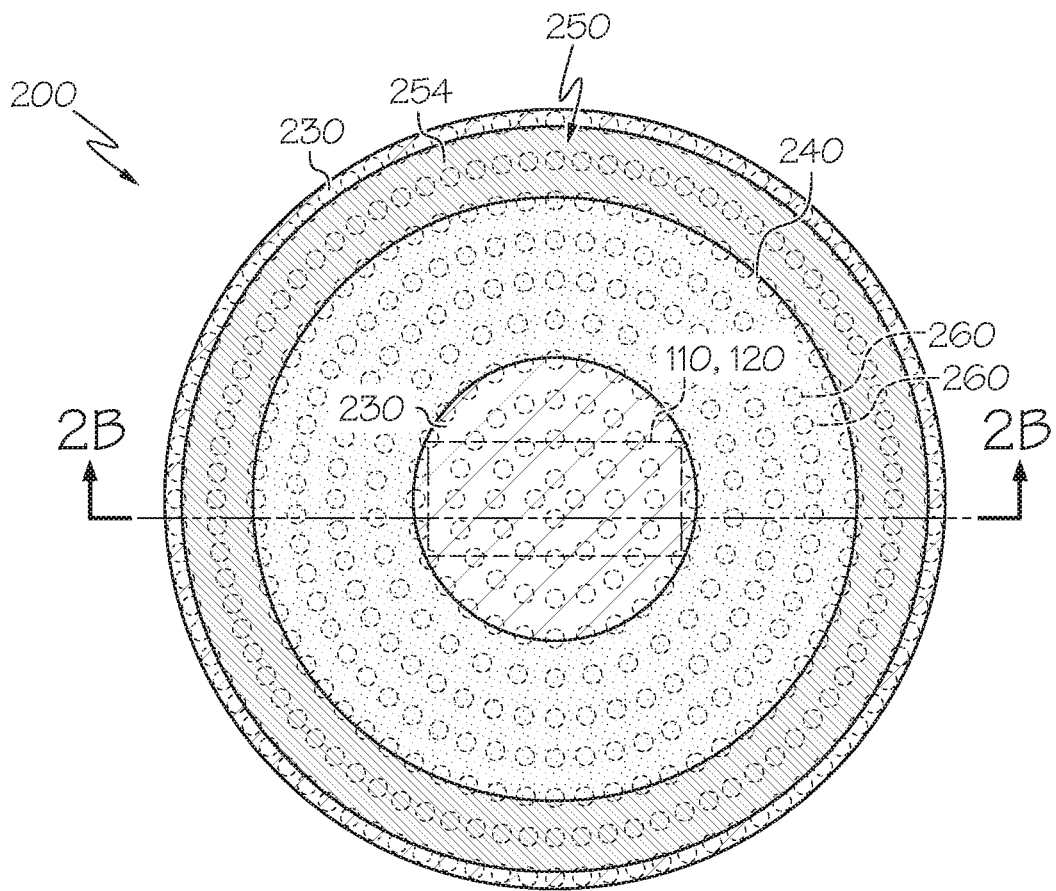
FIG. 2A depicts a cross-sectional top view of an example electronic assembly having a cylindrical substrate and a heat-storing region comprising a phase change material, according to one or more embodiments shown and described herein.
Figure 2B:
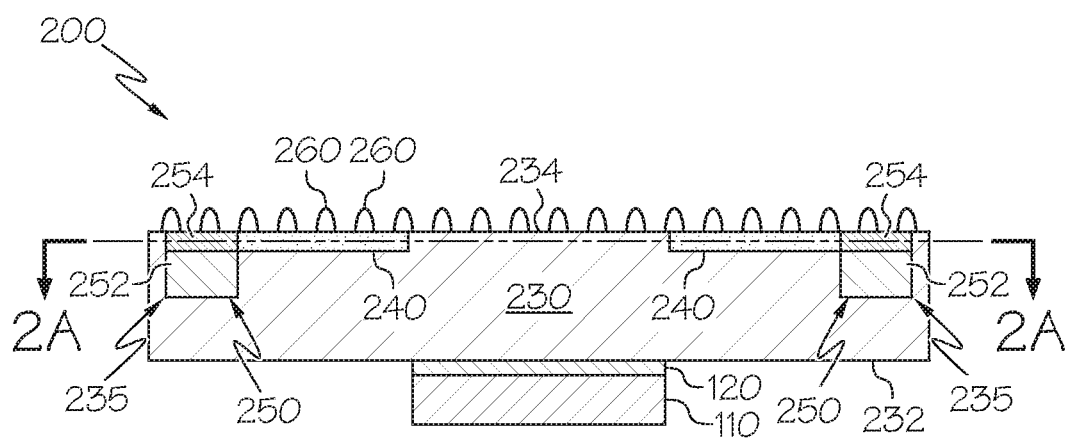
FIG. 2B depicts a cross-sectional side view of the electronic assembly of FIG. 2A, according to one or more embodiments shown and described herein.

FIG. 2A and FIG. 2B depict a cross-sectional top view and a cross-sectional side view respectively of an example electronic assembly 200 having a cylindrical substrate 230, which despite having a different shape, is substantially similar to the substrate 130 described above. The substrate 230 has a first surface 232 and a second surface 234 opposite to the first surface 232. The electronic device(s) 110 is bonded to the first surface 232 through the bonding layer 120. The second surface 234 provides a thermal interface for air-cooling or a liquid cooling device. In some embodiments, the second surface 234 of the substrate 230 may include a plurality of heat sink fins 260 as a secondary cooling mechanism to dissipate additional heat from the substrate 130. The plurality of heat sink fins 260 are substantially similar to the plurality of heat sink fins 160 described above.

In the embodiment shown in FIGS. 2A-2B, the substrate 230 includes a heat-storing region 250 embedded within a groove 235 of the substrate 230 proximate to the second surface 234 around a perimeter (circumference) of the second surface 234. The heat-storing region 250 is substantially similar to the heat-storing region 150 described above and includes a phase change material 252 encapsulated by an encapsulating layer 254. The phase change material 252 is substantially similar to the phase change material 152 described above. The encapsulating layer 254 is substantially similar to the encapsulating layer 154 described above.

The substrate 230 includes a heat transfer layer 240 embedded v Within, which is substantially similar to the heat transfer layer 140 described above. The heat transfer layer 240 extends between and thermally connects the heat-storing region 250 to the electronic device(s) 110. In some embodiments such as the one shown in FIGS. 2A-2B, the heat transfer layer 240 is proximate to the second surface 234 and stretches between the heat-storing region 250 and a thermal projection of the electronic device 110 along the second surface 234 of the substrate 230. In operation, the substrate 230 functions in a substantially similar way as the substrate 130 described above.

Figure 3A:
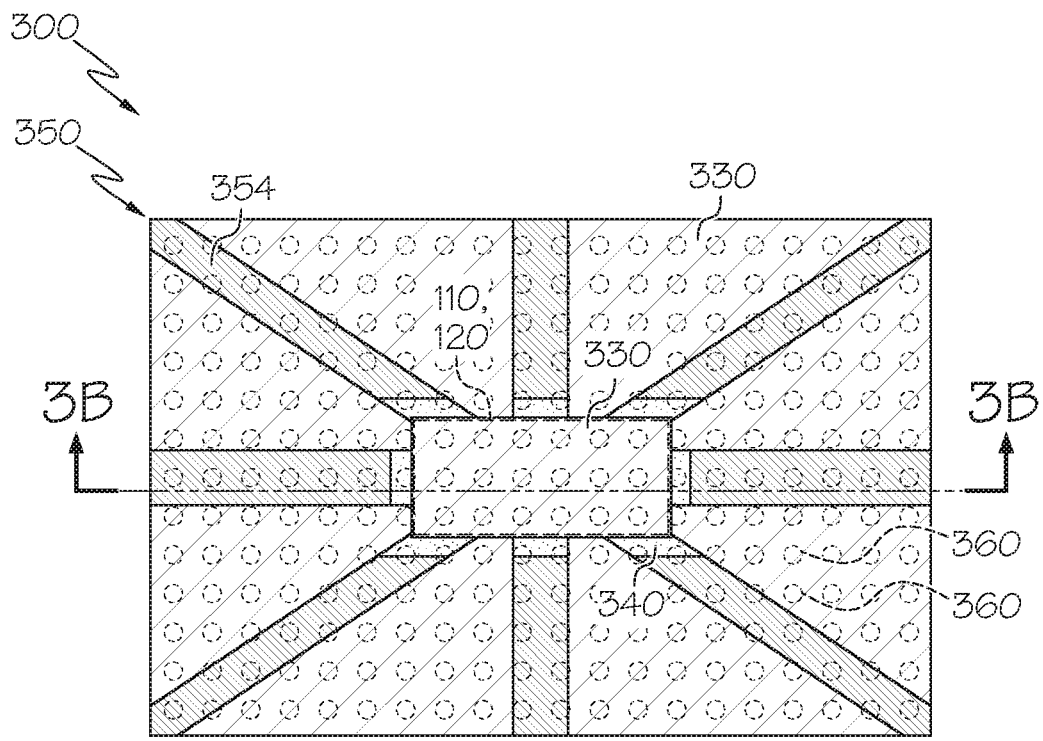
FIG. 3A depicts a cross-sectional top view of an example electronic assembly having a cuboidal substrate with a plurality of grooves distributed radially from a central region thereof and a heat-storing region comprising a phase change material disposed within the plurality of grooves, according to one or more embodiments shown and described herein.
Figure 3B:
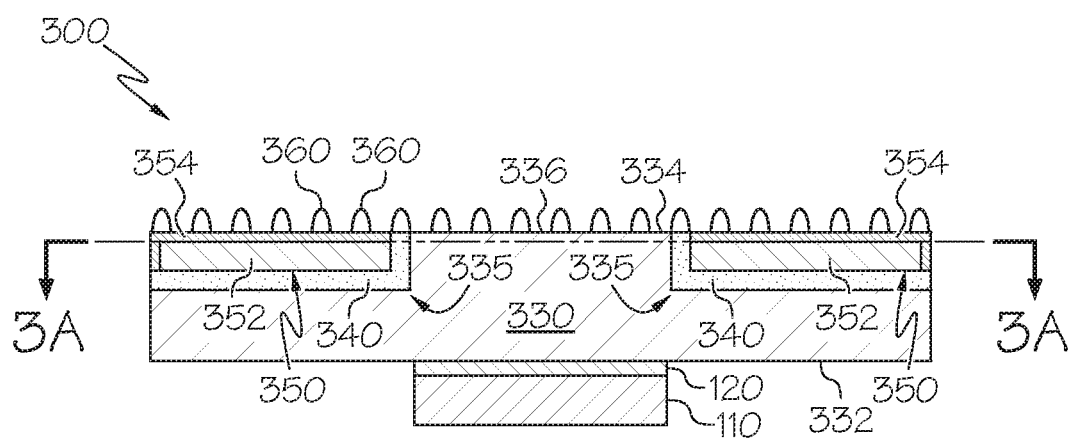
FIG. 3B depicts a cross-sectional side view of the electronic assembly of FIG. 3A, according to one or more embodiments shown and described herein.

FIG. 3A and FIG. 3B depict a cross-sectional top view and a cross-sectional side view respectively of an example electronic assembly 300 having a cuboidal substrate 330 with a plurality of grooves 335 distributed radially from a central region 336 of the substrate 330. This feature is unlike the grooves 135 and 235 disposed around a perimeter (or circumference) of the second surfaces 134 and 234 respectively (shown in FIGS. 1A-1B and FIGS. 2A-2B respectively). The substrate 330 includes the plurality of grooves 335 but is otherwise substantially similar to the substrate 130 described above. The substrate 330 has a first surface 332 and a second surface 334 opposite to the first surface 332. The electronic device(s) 110 is bonded to the first surface 332 through the bonding layer 120. The second surface 334 provides a thermal interface for air-cooling or a liquid cooling device. In some embodiments, the second surface 334 of the substrate 330 may include a plurality of heat sink fins 360 as a secondary cooling mechanism to dissipate additional heat from the substrate 330. The plurality of heat sink fins 360 are substantially similar to the plurality of heat sink fins 160 described above.

In the embodiment shown in FIGS. 3A-3B, the substrate 330 includes a plurality of heat transfer layers 340, wherein each heat-transfer layer 340 is disposed within each of the plurality of grooves 335 along the second surface 334 of the substrate 330. Each heat transfer layer 340 is substantially similar to the heat transfer layer 140 described above. Thus, in the embodiment shown in FIGS. 3A-3B, the heat-transfer layer 340 does not extend across the entire second surface 334 (as the heat transfer layers 140 and 240 shown in FIGS. 1A-1B and FIGS. 2A-2B respectively) but rather within each of the plurality of grooves 335 extending radially from the central region 336.

A heat-storing region 350 is disposed over each of the plurality of heat transfer layers 340 such that the substrate 330 has a plurality of heat-storing regions 350. Each heat-storing region 350 is substantially similar to the heat-storing region 150 described above and includes a phase change material 352 encapsulated by an encapsulating layer 354. The phase change material 352 is substantially similar to the phase change material 52 described above. The encapsulating layer 354 is substantially similar to the encapsulating layer 154 described above. The heat transfer layer 340 thermally connects each of the plurality of heat-storing regions 350 to the electronic device(s) 110. In operation, the substrate 330 functions in a substantially similar way as the substrate 130 described above.

In some embodiments (not shown), each of the plurality of grooves 335 may have different kinds of heat-storing regions having distinct properties and characteristics (for example, different melting temperatures of the phase change materials within the heat-storing regions). As a non-limiting example, a first heat-storing region similar to the heat-storing region 150 may be disposed within some but not all of a plurality of grooves 335 along the second surface 334 of the substrate 330. A second heat-storing region different from the heat-storing region 150 may be disposed within any of the plurality of grooves not having the first heat-storing region. In some embodiments, the first heat-storing region and the second heat-storing region may have some different properties and characteristics (for example, different melting temperatures of the phase change materials in the first heat-storing region and the second heat-storing region), while being similar to each other in other aspects.

Figure 4A:
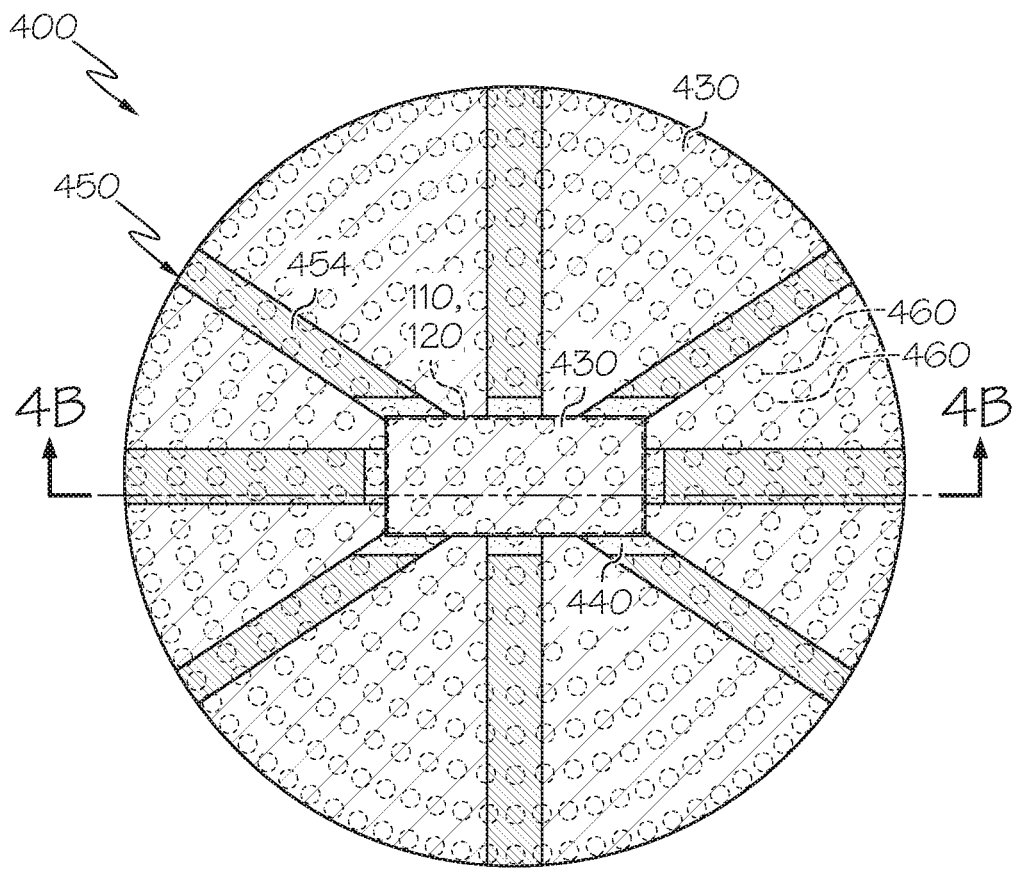
FIG. 4A depicts a cross-sectional top view of an example electronic assembly having a cylindrical substrate with a plurality of grooves distributed radially from a central region thereof and a heat-storing region comprising a phase change material disposed within the plurality of grooves, according to one or more embodiments shown and described herein.
Figure 4B:
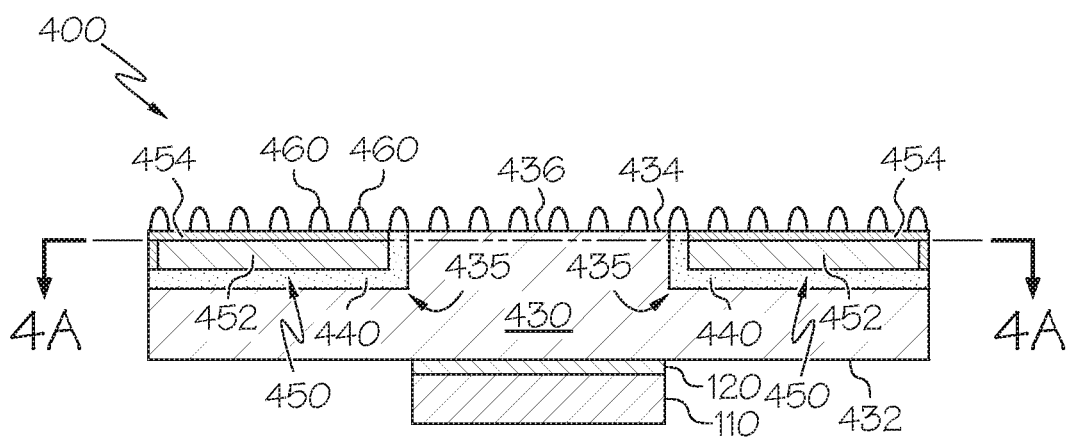
FIG. 4B depicts a cross-sectional side view of the electronic assembly of FIG. 4A, according to one or more embodiments shown and described herein.

FIG. 4A and FIG. 4B depict a cross-sectional top view and a cross-sectional side view respectively of an example electronic assembly 400 having a cylindrical substrate 430 with a plurality of grooves 435 distributed radially from a central region 436 of the substrate 430. This feature is unlike the grooves 135 and 235 disposed around a perimeter (or circumference) of the second surfaces 134 and 234 respectively (shown in FIGS. 1A-1B and FIGS. 2A-2B respectively). The substrate 430 includes the plurality of grooves 435 but is otherwise substantially similar to the substrate 230 described above. The substrate 430 has a first surface 432 and a second surface 434 opposite to the first surface 432. The electronic device(s) 110 is bonded to the first surface 432 through the bonding layer 120. The second surface 434 provides a thermal interface for air-cooling or a liquid cooling device. In some embodiments, the second surface 434 of the substrate 430 may include a plurality of heat sink fins 460 as a secondary cooling mechanism to dissipate additional heat from the substrate 430. The plurality of heat sink fins 460 are substantially similar to the plurality of heat sink fins 160 described above.

In the embodiment shown in FIGS. 4A-4B, the substrate 430 includes a plurality of heat transfer layers 440, wherein each heat-transfer layer 440 is disposed within each of the plurality of grooves 435 along the second surface 434 of the substrate 430. Each heat transfer layer 440 is substantially similar to the heat transfer layer 140 described above. Thus, in the embodiment shown in FIGS. 4A-4B, the heat-transfer layer 440 does not extend across the entire second surface 434 (as the heat transfer layers 140 and 240 shown in FIGS. 1A-1B and FIGS. 2A-2B respectively) but rather within each of the plurality of grooves 435 extending radially from the central region 436.

A heat-storing region 450 is disposed over each of the plurality of heat transfer layers 440 such that the substrate 430 has a plurality of heat-storing regions 450. Each heat-storing region 450 is substantially similar to the heat-storing region 150 described above and includes a phase change material 452 encapsulated by an encapsulating layer 454. The phase change material 452 is substantially similar to the phase change material 152 described above. The encapsulating layer 454 is substantially similar to the encapsulating layer 154 described above. The heat transfer layer 440 thermally connects each of the plurality of heat-storing regions 450 to the electronic device(s) 110. In operation, the substrate 430 functions in a substantially similar way as the substrate 130 described above.

In some embodiments (not shown), each of the plurality of grooves 435 may have different kinds of heat-storing regions having distinct properties and characteristics (for example, different melting temperatures of the phase change materials within the heat-storing regions), As a non-limiting example, a first heat-storing region similar to the heat-storing region 150 may be disposed within some but not all of a plurality of grooves 435 along the second surface 434 of the substrate 430. A second heat-storing region different from the heat-storing region 150 may be disposed within any of the plurality of grooves not having the first heat-storing region. In some embodiments, the first heat-storing region and the second heat-storing region may have some different properties and characteristics (for example, different melting temperatures of the phase change materials in the first heat-storing region and the second heat-storing region), while being similar to each other in other aspects.

Figure 5A:
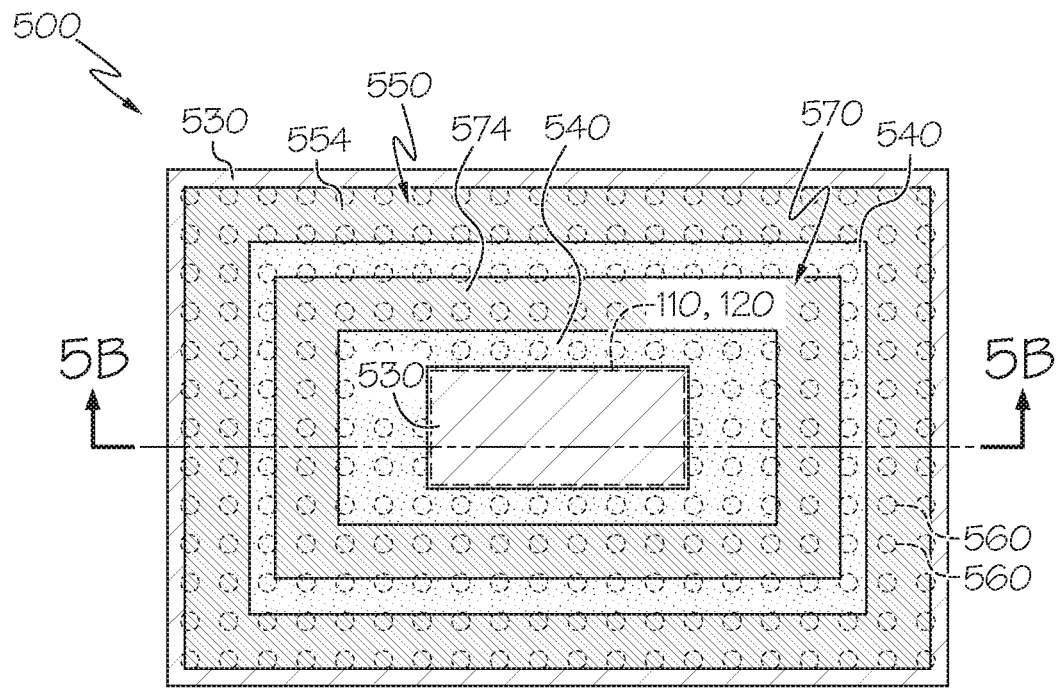
FIG. 5A depicts a cross-sectional top view of an example electronic assembly having a cuboidal substrate and two concentric rectangular heat-storing regions each comprising a phase change material, according to one or more embodiments shown and described herein.
Figure 5B:
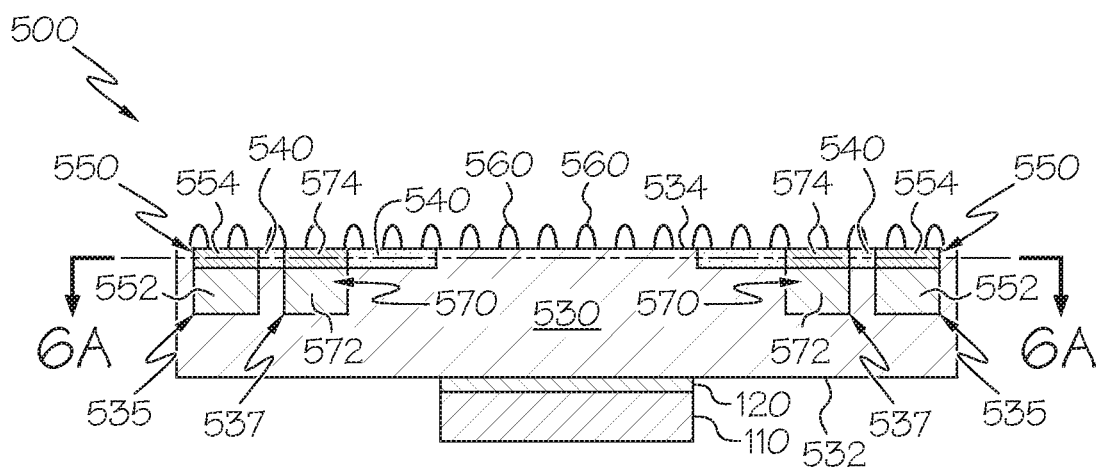
FIG. 5B depicts a cross-sectional side view of the electronic assembly of FIG. 5A, according to one or more embodiments shown and described herein.

FIG. 5A and FIG. 5B depict a cross-sectional top view and a cross-sectional side view respectively of an example electronic assembly 500 having a cuboidal substrate 530 and two concentric rectangular heat-storing regions 550 and 570 embedded within concentric grooves 535 and 537 respectively of the substrate 530. The concentric grooves 535 and 537 are different from the plurality of grooves 335 and 435 distributed radially on the second surfaces 334 and 434 respectively (shown in FIGS. 3A-3B and FIGS. 4A-4B respectively). The substrate 530 is substantially similar to the substrate 130 described above. The substrate 530 has a first surface 532 and a second surface 534 opposite to the first surface 532. The electronic device(s) 110 is bonded to the first surface 532 through the bonding layer 120. The second surface 534 provides a thermal interface for air-cooling or a liquid cooling device. In some embodiments, the second surface 534 of the substrate 530 may include a plurality of heat sink fins 560 as a secondary cooling mechanism to dissipate additional heat from the substrate 530. The plurality of heat sink fins 560 are substantially similar to the plurality of heat sink fins 160 described above.

In the embodiment shown in FIGS. 5A-5B, the substrate 530 includes the first heat-storing region 550 embedded within the groove 535 of the substrate 530 and proximate to the second surface 534 around a perimeter of the second surface 534. The first heat-storing region 550 is similar to the heat-storing region 150 described above and includes a phase change material 552 encapsulated by an encapsulating layer 554. The phase change material 552 is similar to the phase change material 152 described above. The encapsulating layer 554 is similar to the encapsulating layer 154 described above.

Additionally, the substrate 530 includes the second concentric heat-storing region 570 embedded within the groove 537 of the substrate 530, proximate to the second surface 534 and having a smaller perimeter than the first heat-storing region 550. The second concentric heat-storing region 570 is similar to the heat-storing region 150 and includes a phase change material 572 encapsulated by an encapsulating layer 574. The phase change material 572 similar to the phase change material 152 described above. The encapsulating layer 574 is similar to the encapsulating layer 154 described above. In some embodiments, the first heat-storing region 550 and the second concentric heat-storing region 570 may be substantially similar to each other. In other embodiments, the first heat-storing region 550 and the second concentric heat-storing region 570 may have some different properties and characteristics (for example, different melting temperatures of the phase change materials 552, 572), while being similar to each other in other aspects.

The substrate 530 includes a heat transfer layer 540 disposed proximate to the second surface 534 and substantially similar to the heat transfer layer 140 described above. The heat transfer layer 540 extends between and thermally connects the first heat-storing region 550 and the second concentric heat-storing region 570 to the electronic device(s) 110. In some embodiments such as the one shown in FIGS.

5A-5B, the heat transfer layer 540 stretches between the second concentric heat-storing region 570 and a thermal projection of the electronic device 110 along the second surface 534 of the substrate 530. In operation, the substrate 530 functions in a substantially similar way as the substrate 130 described above.

Figure 6A:
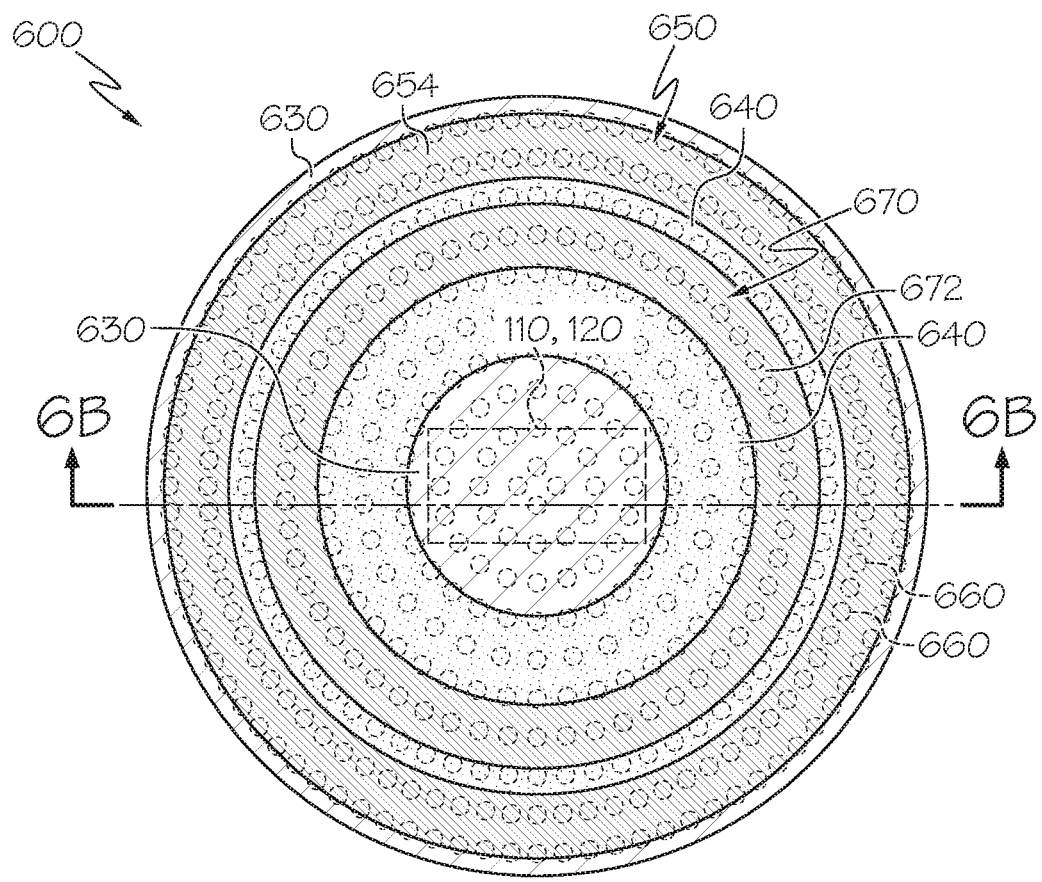
FIG. 6A depicts a cross-sectional top view of an example electronic assembly having a cylindrical substrate and two concentric circular heat-storing regions each comprising a phase change material, according to one or more embodiments shown and described herein.
Figure 6B:
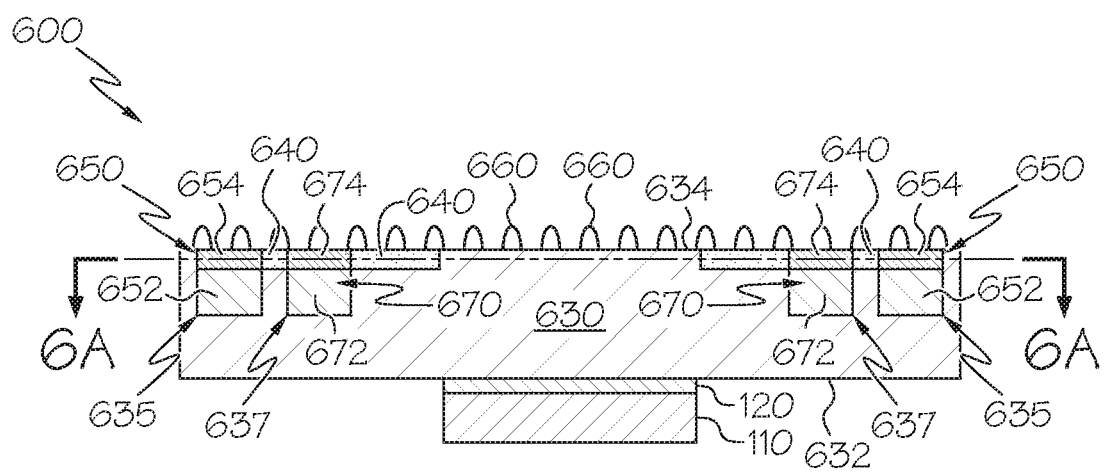
FIG. 6B depicts a cross-sectional side view of the electronic assembly of FIG. 6A, according to one or more embodiments shown and described herein.

FIG. 6A and FIG. 6B depict a cross-sectional top view and a cross-sectional side view respectively of an example electronic assembly 600 having a cylindrical substrate 630 and two concentric circular heat-storing regions 650 and 670 embedded within concentric grooves 635 and 637 respectively of the substrate 630. The concentric grooves 635 and 637 are different from the plurality of grooves 335 and 435 distributed radially on the second surfaces 334 and 434 respectively (shown in FIGS. 3A-3B and FIGS. 4A-4B respectively). The substrate 630 is substantially similar to the substrate 230 described above. The substrate 630 has a first surface 632 and a second surface 634 opposite to the first surface 632. The electronic device(s) 110 is bonded to the first surface 632 through the bonding layer 120. The second surface 634 provides a thermal interface for air-cooling or a liquid cooling device. In some embodiments, the second surface 634 of the substrate 630 may include a plurality of heat sink fins 660 as a secondary cooling mechanism to dissipate additional heat from the substrate 630. The plurality of heat sink fins 660 are substantially similar to the plurality of heat sink fins 160 described above.

In the embodiment shown in FIGS. 6A-6B, the substrate 630 includes the first heat-storing region 650 embedded within the groove 635 of the substrate 630 and proximate to the second surface 634 around a perimeter (circumference) of the second surface 634. The first heat-storing region 650 is similar to the heat-storing region 150 described above and includes a phase change material 652 encapsulated by an encapsulating layer 654. The phase change material 652 is similar to the phase change material 152 described above. The encapsulating layer 654 is similar to the encapsulating layer 154 described above.

Additionally, the substrate 630 includes the second concentric heat-storing region 670 embedded within the groove 637 of the substrate 630, proximate to the second surface 634 and having a smaller perimeter (circumference) than the first heat-storing region 650. The second concentric heat-storing region 670 is similar to the heat-storing region 150 and includes a phase change material 672 encapsulated by an encapsulating layer 674. The phase change material 672 is similar to the phase change material 152 described above. The encapsulating layer 674 is similar to the encapsulating layer 154 described above. In some embodiments, the first heat-storing region 650 and the second concentric heat-storing region 670 may be substantially similar to each other. In other embodiments, the first heat-storing region 650 and the second concentric heat-storing region 670 may have some different properties and characteristics (for example, different melting temperatures of the phase change materials 652, 672), while being similar to each other in other aspects.

The substrate 630 includes a heat transfer layer 640 disposed proximate to the second surface 634 and substantially similar to the heat transfer layer 140 described above. The heat transfer layer 640 extends between and thermally connects the first heat-storing region 650 and the second concentric heat-storing region 670 to the electronic device(s) 110. In some embodiments such as the one shown in FIGS. 6A-6B, the heat transfer layer 640 stretches between the second concentric heat-storing region 670 and a thermal projection of the electronic device 110 along the second surface 634 of the substrate 630. In operation, the substrate 630 functions in a substantially similar way as the substrate 130 described above.

It should be understood that various other configurations of the substrates with embedded heat-storing regions may be possible using the principles and ideas underlying the example embodiments described and illustrated herein. All such configurations are intended to be included within the scope of the disclosure.

Electronic devices utilized in applications for hybrid and electric vehicles, such as semiconductor devices may generate a significant amount of heat during operation. The substrates with embedded heat-storing regions described and illustrated herein render efficient in-situ mechanism for management of the generated heat. In embodiments, the substrates with embedded heat-storing regions advantageously provide a compact package design that enables high-capacity absorption and storage of the heat generated by the electronic device(s), while also eliminating the need for additional dedicated cooling mechanisms for removing the heat. At the same time, the magnitude of temperature cycling (i.e., the temperature difference between two extremes of a temperature cycling curve) of the electronic assembly having such substrates decreases, thereby minimizing the thermally-induced mechanical stress to the electronic assembly when operating the threshold temperature and during temperature cycling.

It is noted that the terms "substantially" and "about" may be utilized herein to include the inherent degree of uncertainty that may be attributed to any quantitative comparison, value, measurement, or other representation. These terms are also utilized herein to represent the degree by which a quantitative representation may vary from a stated reference without resulting in a change in the basic function and intended scope of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A substrate for an electronic assembly comprising:
   a first surface configured to be bonded to one or more electronic devices;
   a first heat-storing region disposed within grooves in and around a perimeter of a second surface opposite the first surface such that the first heat-storing region is embedded within the substrate, wherein
   the first heat-storing region comprises a phase change material encapsulated by an encapsulating layer;
   a heat transfer layer embedded within the substrate and thermally connecting the first heat-storing region to the one or more electronic devices, and
   a second concentric heat-storing region thermally connected to the heat transfer layer, wherein the second concentric heat-storing region comprises a phase change material encapsulated by a second encapsulating layer.

2. The substrate of claim 1, wherein the substrate is formed from copper, nickel, aluminum or alloys thereof.

3. The substrate of claim 1, wherein the heat transfer layer comprises an inlay formed from a material having thermal conductivity greater than 100 W/m*K.

4. The substrate of claim 1, wherein the heat transfer layer comprises a heat pipe having a condenser section proximate to the first heat-storing region and an evaporator section proximate to the one or more electronic devices.

5. The substrate of claim 1, wherein the phase change material comprises indium, tin, bismuth or paraffin wax.

6. The substrate of claim 1, wherein the encapsulating layer comprises a metal selected from a group consisting of: ruthenium, rhodium, palladium, osmium, iridium, and platinum.

7. The substrate of claim 1, wherein:
the first heat-storing region is disposed within a plurality of grooves distributed radially from a central region of the substrate along the second surface of the substrate; and
the heat transfer layer is disposed between the plurality of grooves.

8. An electronic assembly comprising:
a substrate having a first surface and a second surface opposite to the first surface;
one or more electronic devices bonded to the first surface of the substrate;
a first heat-storing region disposed within grooves in and around a perimeter of a second surface opposite the first surface such that the first heat-storing region is embedded within the, wherein
the first heat-storing region comprises a phase change material encapsulated by an encapsulating layer;
a heat transfer layer embedded within the substrate and thermally connecting the first heat-storing region to the one or more electronic devices; and
a second concentric heat-storing region thermally connected to the heat transfer layer, wherein
the second concentric heat-storing region comprises a phase change material encapsulated by a second encapsulating layer.

9. The electronic assembly of claim 8, wherein the substrate comprises copper, nickel, aluminum or alloys thereof.

10. The electronic assembly of claim 8 further comprising a plurality of heat sink fins disposed on the second surface of the substrate.

11. The electronic assembly of claim 8, wherein the heat transfer layer comprises an inlay formed from a material having thermal conductivity greater than 100 W/m*K.

12. The electronic assembly of claim 8, wherein the heat transfer layer comprises a heat pipe having a condenser section proximate to the first heat-storing region and an evaporator section proximate to the one or more electronic devices.

13. The electronic assembly of claim 8, wherein the phase change material comprises indium, tin, bismuth or paraffin wax.

14. The electronic assembly of claim 8, wherein the encapsulating layer comprises a metal selected from a group consisting of: ruthenium, rhodium, palladium, osmium, iridium, and platinum.

15. The electronic assembly of claim 8, wherein:
the first heat-storing region is disposed within a plurality of grooves distributed radially from a central region of the substrate along the second surface of the substrate; and
the heat transfer layer is disposed between the plurality of grooves.

16. The electronic assembly of claim 8, wherein:
the first heat-storing region is disposed within some but not all of a plurality of grooves along the second surface of the substrate;
a second heat-storing region is disposed within any of the plurality of grooves not having the first heat-storing region disposed therein; and
the heat transfer layer is disposed between the plurality of grooves.

* * * * *

UNITED STATES PATENT AND TRADEMARK OFFICE
CERTIFICATE OF CORRECTION

PATENT NO.         : 11,754,343 B2
APPLICATION NO.    : 16/674784
DATED              : September 12, 2023
INVENTOR(S)        : Shailesh N. Joshi and Ercan M. Dede Page 1 of 1

It is certified that error appears in the above-identified patent and that said Letters Patent is hereby corrected as shown below:

In the Specification

In Column 5, Line(s) 8, after "W/m*K", delete "," and insert --.--, therefor.

In Column 7, Line(s) 65, after "regions)", delete "," and insert --.--, therefor.

In Column 8, Line(s) 50, after "material 572", insert --is--.

In Column 10, Line(s) 26, after "operating", insert --at--.

Signed and Sealed this
Twenty-first Day of November, 2023

Katherine Kelly Vidal
*Director of the United States Patent and Trademark Office*